(12) United States Patent
Lee

(10) Patent No.: US 12,210,070 B2
(45) Date of Patent: Jan. 28, 2025

(54) BATTERY DIAGNOSIS SYSTEM, POWER SYSTEM AND BATTERY DIAGNOSIS METHOD

(71) Applicant: LG ENERGY SOLUTION, LTD., Seoul (KR)

(72) Inventor: Jin-Kyu Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 428 days.

(21) Appl. No.: 17/629,720

(22) PCT Filed: Jan. 14, 2021

(86) PCT No.: PCT/KR2021/000561
§ 371 (c)(1),
(2) Date: Jan. 24, 2022

(87) PCT Pub. No.: WO2021/149973
PCT Pub. Date: Jul. 29, 2021

(65) Prior Publication Data
US 2022/0268853 A1    Aug. 25, 2022

(30) Foreign Application Priority Data

Jan. 22, 2020  (KR) .................. 10-2020-0008778
Jan. 13, 2021  (KR) .................. 10-2021-0004897

(51) Int. Cl.
*G01R 31/396* (2019.01)
*G01R 31/367* (2019.01)
(Continued)

(52) U.S. Cl.
CPC ......... *G01R 31/396* (2019.01); *G01R 31/367* (2019.01); *G01R 31/3835* (2019.01);
(Continued)

(58) Field of Classification Search
CPC ............ G01R 31/396; G01R 31/367; G01R 31/3835; G01R 31/389; G01R 31/392;
(Continued)

(56) References Cited

U.S. PATENT DOCUMENTS

2003/0137277 A1    7/2003  Mori et al.
2009/0326749 A1   12/2009  Uchida
(Continued)

FOREIGN PATENT DOCUMENTS

CN    102269798 A    12/2011
CN    102749585 A    10/2012
(Continued)

OTHER PUBLICATIONS

International Search Report for PCT/KR2021/000561 (PCT/ISA/210) mailed on Apr. 29, 2021.
(Continued)

*Primary Examiner* — Farhana A Hoque
*Assistant Examiner* — Joseph O Nyamogo
(74) *Attorney, Agent, or Firm* — Birch, Stewart, Kolasch & Birch, LLP

(57) ABSTRACT

Discussed is a battery diagnosis system for a battery pack including a battery group of a plurality of batteries connected in series, and a battery management system to transmit a notification signal indicating a battery parameter of each of the plurality of batteries. The battery diagnosis system includes a communication device to collect the notification signal via at least one of a wired network or a wireless network, a data preprocessing device to update big data indicating a change history of the battery parameter of each battery based on the notification signal, and a data analysis device to determine dispersion information of a data set including a plurality of characteristics values indicating the battery parameter of each of the plurality of batteries (Continued)

from the big data, and determine whether each battery is faulty based on the dispersion information and the plurality of characteristics values.

14 Claims, 8 Drawing Sheets

(51) Int. Cl.
  *G01R 31/3835* (2019.01)
  *G01R 31/389* (2019.01)
  *G01R 31/392* (2019.01)
  *H01M 10/42* (2006.01)
  *H01M 10/48* (2006.01)
  *H02J 7/00* (2006.01)

(52) U.S. Cl.
  CPC ......... *G01R 31/389* (2019.01); *G01R 31/392* (2019.01); *H01M 10/425* (2013.01); *H01M 10/482* (2013.01); *H02J 7/00032* (2020.01); *H02J 7/0013* (2013.01); *H02J 7/0048* (2020.01); *H02J 7/005* (2020.01); *H01M 2010/4271* (2013.01); *H01M 2010/4278* (2013.01); *Y02E 60/10* (2013.01)

(58) Field of Classification Search
  CPC ............... G01R 31/3648; G01R 31/382; H02J 7/00032; H02J 7/0013; H02J 7/0048; H02J 7/005; H01M 10/482; H01M 2010/4271; H01M 2010/4278; H01M 10/425; Y02E 60/10
  See application file for complete search history.

(56) References Cited

U.S. PATENT DOCUMENTS

| | | | |
|---|---|---|---|
| 2010/0036626 A1 | 2/2010 | Kang et al. | |
| 2011/0077881 A1 | 3/2011 | Matsumura et al. | |
| 2013/0030739 A1* | 1/2013 | Takahashi | G01R 31/392 702/63 |
| 2015/0046109 A1* | 2/2015 | Miwa | H01M 10/482 702/63 |
| 2016/0266210 A1 | 9/2016 | Kang et al. | |
| 2017/0106766 A1* | 4/2017 | Duan | H01M 10/425 |
| 2018/0074129 A1* | 3/2018 | Nakao | B60L 50/60 |
| 2018/0203070 A1 | 7/2018 | Park | |
| 2018/0254640 A1 | 9/2018 | Jung et al. | |
| 2018/0262027 A1 | 9/2018 | Jung et al. | |
| 2019/0170829 A1* | 6/2019 | Srinivasan | G01R 31/3648 |
| 2019/0392320 A1 | 12/2019 | Kim | |
| 2021/0055355 A1 | 2/2021 | Gelso et al. | |
| 2021/0091581 A1 | 3/2021 | Kamijima | |

FOREIGN PATENT DOCUMENTS

| | | |
|---|---|---|
| CN | 105137389 A | 12/2015 |
| CN | 107728076 A | 2/2018 |
| CN | 107748330 A | 3/2018 |
| CN | 107923942 A | 4/2018 |
| CN | 109713793 A | 5/2019 |
| JP | 11-23676 A | 1/1999 |
| JP | 2002-8733 A | 1/2002 |
| JP | 2002-58102 A | 2/2002 |
| JP | 2002-334726 A | 11/2002 |
| JP | 2007-55450 A | 3/2007 |
| JP | 2008-83022 A | 4/2008 |
| JP | 2011-76746 A | 4/2011 |
| JP | 2015-31588 A | 2/2015 |
| JP | 5768001 B2 | 8/2015 |
| JP | 2017-500835 A | 1/2017 |
| JP | 2019-125482 A | 7/2019 |
| JP | 2020-9646 A | 1/2020 |
| KR | 10-2010-0019249 A | 2/2010 |
| KR | 10-2016-0111615 A | 9/2016 |
| KR | 10-2018-0085165 A | 7/2018 |
| KR | 10-2018-0101930 A | 9/2018 |
| KR | 10-2018-0103575 A | 9/2018 |
| KR | 10-1949449 B1 | 2/2019 |
| KR | 10-1946163 B1 | 4/2019 |
| KR | 10-2019-0100114 A | 8/2019 |
| WO | WO 2019/235646 A1 | 12/2019 |

OTHER PUBLICATIONS

Extended European Search Report dated Oct. 10, 2022 for Application No. 21743768.0.

Hong et al., "Multi-fault synergistic diagnosis of battery systems based on the modified multi-scale entropy", Wiley International Journal of Energy Research, vol. 43, No. 14, 2019, pp. 8350-8369, https://doi.org/10.1002/er.4831.

Kang et al., "Online multi-fault detection and diagnosis for battery packs in electric vehicles", Applied Energy, Elsevier, vol. 259, 2020, pp. 1-16.

Liu et al., "High-dimensional data abnormity detection based on improved Variance-of-Angel (VOA) algorithm for electric vehicles battery", IEEE Energy Conversion Congress and Exposition (ECCE), 2019, pp. 5072-5077.

Wang et al., "Voltage fault diagnosis and prognosis of battery systems based on entropy and Z-score for electric vehicles", Applied Energy, Elsevier, vol. 196, 2017, pp. 289-302.

* cited by examiner

BATTERY DIAGNOSIS SYSTEM, POWER SYSTEM AND BATTERY DIAGNOSIS METHOD

TECHNICAL FIELD

The present disclosure relates to technology for fault detection in each battery using statistical analysis of battery parameter(s) monitored from the plurality of batteries.

The present application claims the benefit of Korean Patent Application No. 10-2020-0008778 filed on Jan. 22, 2020 and Korean Patent Application No. 10-2021-0004897 filed on Jan. 13, 2021, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery group for an apparatus requiring high capacity and high voltage such as an electric vehicle or an energy storage system includes a plurality of batteries connected in series. In general, a battery management system is provided to acquire battery parameter(s) of each battery, and perform various functions (for example, balancing, cooling) for ensuring the reliability and safety of each battery.

However, conventionally, due to the software limitation (for example, data processing performance) and/or hardware limitation (for example, memory capacity) of the battery management system, there is a limitation on the monitoring of the characteristics deviation between the plurality of batteries manufactured with the same electrical and chemical properties and performance and included in the same battery group over the entire life of the battery group from the manufacture time to the replacement time.

Meanwhile, the characteristics deviation of the plurality of batteries tend to gradually increase during the operation of the battery group, and it is a natural phenomenon since the battery is a sort of consumable. If each battery is not properly controlled, the characteristics deviation between the plurality of batteries increases much more than the expected normal level from the usage history of the battery group. As a consequence, the overall charge/discharge performance and efficiency of the battery group reduce and the fire risk increases.

DISCLOSURE

Technical Problem

The present disclosure is designed to solve the above-described problem, and therefore the present disclosure is directed to providing a battery diagnosis system configured to perform some of the functions of a battery management system in place of the battery management system, a power system and a battery diagnosis method, whereby it is possible to diagnose a fault in each battery included in a battery group more accurately and efficiently using the battery diagnosis system.

The present disclosure is further directed to providing a battery diagnosis system, a power system and a battery diagnosis method, in which a fault in each battery is detected (predicted) from big data using statistical analysis, the big data generated and updated by accumulating battery parameter(s) of each of the plurality of batteries in a time series over the entire life of the battery group.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery diagnosis system according to an aspect of the present disclosure is for a battery pack. The battery pack includes a battery group comprising a plurality of batteries connected in series, and a battery management system electrically coupled to two terminals of each of the plurality of batteries and configured to transmit a notification signal indicating a battery parameter of each battery. The battery diagnosis system includes a communication device configured to collect the notification signal via at least one of a wired network or a wireless network, a data preprocessing device configured to update big data indicating a change history of the battery parameter of each battery based on the notification signal, and a data analysis device configured to extract a data set including a plurality of characteristics values indicating the battery parameter of each of the plurality of batteries from the big data, determine dispersion information of the data set, and determine whether each battery is faulty based on the dispersion information and the plurality of characteristics values.

The dispersion information may include a standard deviation and an average of the plurality of characteristics values.

The data analysis device may be configured to determine a deviation ratio for each battery at a predetermined time interval, wherein the deviation ratio is a ratio of a deviation of interest to the standard deviation. The deviation of interest is a difference between the average and the characteristics value. The data analysis device may be configured to determine a change in the deviation ratio for each battery at the predetermined time interval. The data analysis device may be configured to determine a reference change at the predetermined time interval based on an increase in accumulated energy used in charge/discharge from a manufacture time of the battery group. The data analysis device may be configured to determine each battery having the change in the deviation ratio that is larger than the reference change as faulty at the predetermined time interval.

The data analysis device may be configured to determine a usage score at the predetermine time interval based on the increase in accumulated energy. The usage score is a degradation factor having a positive correlation with an elapsed time from the manufacture time of the battery group and the accumulated energy. The data analysis device may be configured to determine, at the predetermine time interval, the reference change corresponding to the usage score using a first conversion function defining a positive correlation between the usage score and the reference change.

The data analysis device may be configured to determine a deviation of interest for each battery at a predetermined time interval, wherein the deviation of interest is a difference between the average and the characteristics value.

The data analysis device may be configured to determine a reference coefficient at the predetermined time interval based on an increase in accumulated energy used in charge/discharge from a manufacture time of the battery group. The data analysis device may be configured to determine each battery having the deviation of interest that is larger than an allowable limit as faulty for each battery at the predetermined time interval, the allowable limit is the reference coefficient multiplied by the standard deviation.

The data analysis device may be configured to determine a usage score at the predetermined time interval based on the increase in accumulated energy. The usage score is a degradation factor having a positive correlation with an elapsed time from the manufacture time of the battery group and the accumulated energy. The data analysis device may be configured to determine the reference coefficient corresponding to the usage score at the predetermined time interval using a second conversion function defining a positive correlation between the usage score and the reference coefficient.

The data analysis device may be configured to transmit, at the predetermined time interval, a diagnosis message including identification information of each battery determined as faulty among the plurality of batteries to the battery management system using the communication device.

The battery parameter may be a weighted average of at least one of a voltage, a temperature, an extent of swelling, a State Of Charge (SOC), a State Of Health (SOH), an internal resistance or a self-discharge rate.

A power system according to another aspect of the present disclosure includes the battery diagnosis system.

A battery diagnosis method according to still another aspect of the present disclosure is executable at a predetermined time interval by the battery diagnosis system. The battery diagnosis method includes updating, by the battery diagnosis system, the big data indicating the change history of the battery parameter of each battery based on the notification signal transmitted by the battery management system, extracting, by the battery diagnosis system, the data set including the plurality of characteristics values indicating the battery parameter of each of the plurality of batteries from the big data, determining, by the battery diagnosis system, the dispersion information of the data set, and determining, by the battery diagnosis system, whether each battery is faulty, based on the dispersion information and the plurality of characteristics values.

The dispersion information may include a standard deviation and an average of the plurality of characteristics values.

Determining whether each battery is faulty may include determining the deviation ratio for each battery, wherein the deviation ratio is a ratio of the deviation of interest to the standard deviation, and the deviation of interest is a difference between the average and the characteristics value, determining the change in the deviation ratio for each battery, determining the reference change based on the increase in accumulated energy used in charge/discharge from the manufacture time of the battery group, and determining each battery having the change in the deviation ratio that is larger than the reference change.

Determining whether each battery is faulty may include determining the deviation of interest for each battery, wherein the deviation of interest is a difference between the average and the characteristics value, determining the reference coefficient based on the increase in accumulated energy used in charge/discharge from the manufacture time of the battery group, and determining each battery having the deviation of interest that is larger than the allowable limit as faulty, the allowable limit is the reference coefficient multiplied by the standard deviation.

Advantageous Effects

According to at least one of the embodiments of the present disclosure, it is possible to diagnose a fault in each battery included in a battery group more accurately and efficiently using the battery diagnosis system configured to perform some of the functions of the battery management system in place of the battery management system.

According to at least one of the embodiments of the present disclosure, it is possible to detect (predict) a fault in each battery from big data using statistical analysis, the big data generated and updated by accumulating the battery parameter(s) of each of the plurality of batteries in a time series over the entire life of the battery group.

According to at least one of the embodiments of the present disclosure, it is possible to improve the accuracy of fault detection in each battery by adjusting the allowable limit (allowable range) for the characteristics deviation between the plurality of batteries and/or the battery parameter of each battery based on the usage history of the battery group.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
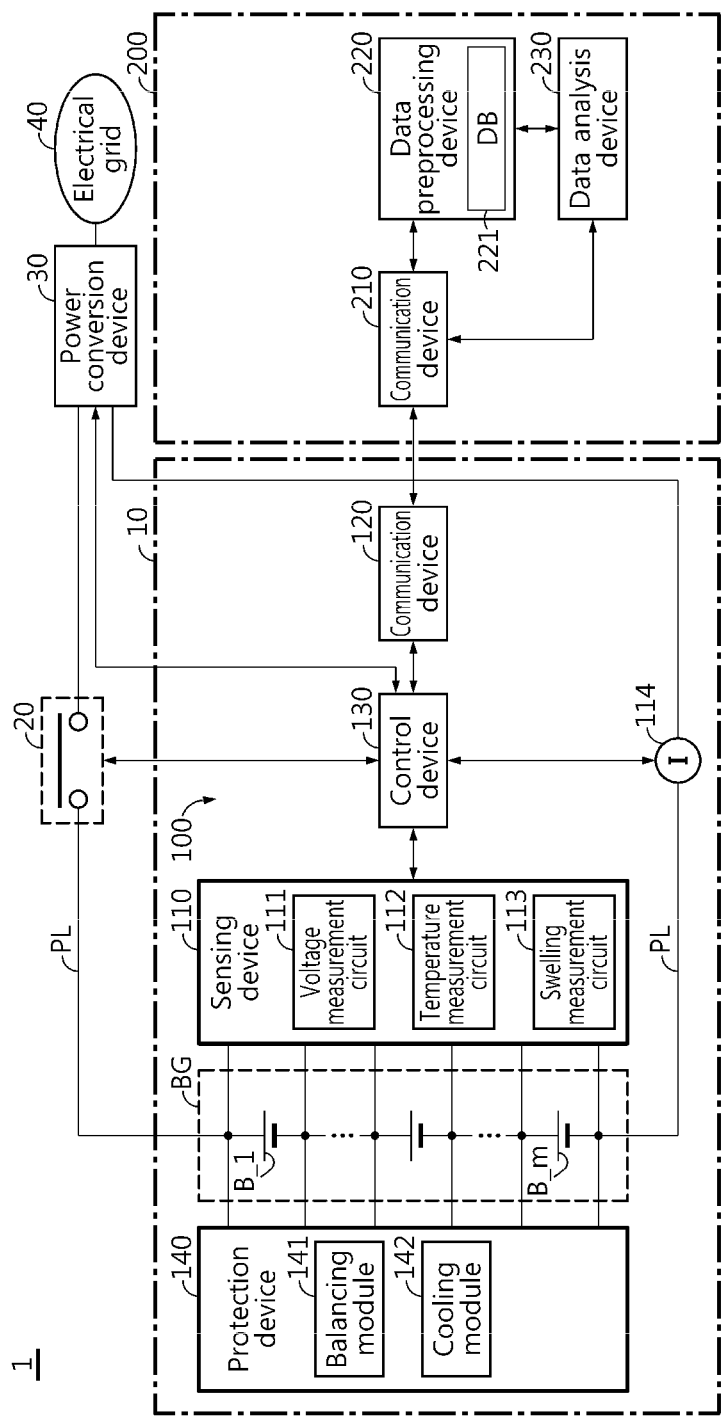
FIG. 1 is a diagram exemplarily showing a configuration of a power system according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

Unless the context clearly indicates otherwise, it will be understood that the term "comprises" when used in this specification, specifies the presence of stated elements, but does not preclude the presence or addition of one or more other elements. In addition, throughout the specification, it will be further understood that when an element is referred to as being "connected to" another element, it can be directly connected to the other element or intervening elements may be present.

Figure 2:
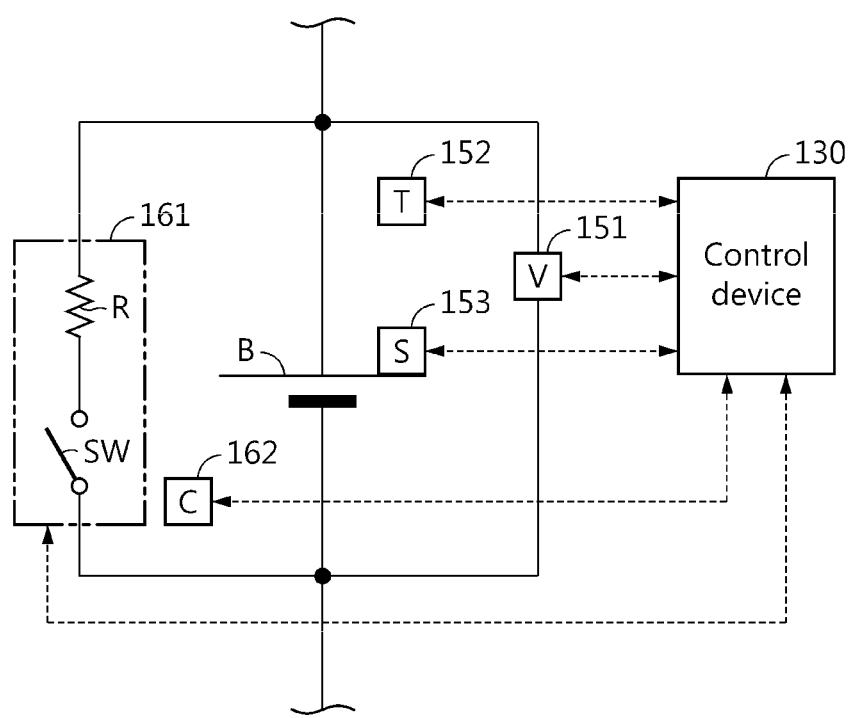
FIG. 2 is a diagram exemplarily showing a connection relationship between a battery and a sensing device and a protection device of a battery management system shown in FIG. 1.

FIG. 1 is a diagram exemplarily showing a configuration of a power system according to the present disclosure, and FIG. 2 is a diagram exemplarily showing a connection relationship between a battery and a sensing device and a protection device of a battery management system shown in FIG. 1.

Referring to FIG. 1, the power system 1 refers collectively to systems including electricity storage means capable of energy input and output, such as, for example, electric vehicles or energy storage systems.

The power system 1 includes a battery pack 10, a relay 20, a power conversion device 30 and a battery diagnosis system 200.

The battery pack 10 includes a battery group BG and a battery management system 100.

The battery group BG includes a plurality of batteries B_1~B_m (m is a natural number of 2 or greater) electrically connected in series. Hereinafter, in the common description to the plurality of batteries B_1~B_m, the reference sign 'B' is used to indicate the battery.

The battery B may include one battery cell or two or more battery cells connected either in series or in parallel or both. The battery cell may include any battery cell that can be repeatedly recharged, such as, for example, a lithium-ion cell, and is not limited to a particular type.

The relay 20 is installed on a power line PL provided as a power path between the battery pack 10 and the power conversion device 30. While the relay 20 is an ON state, power may be transferred from any one of the battery pack 10 and the power conversion device 30 to the other. The relay 20 may include at least one of known switching devices such as, for example, a mechanical contactor, a Field Effect Transistor (FET). The battery management system 100 may control the relay 20 for the switching between ON-OFF according to the state of the battery group BG.

The power conversion device 30 may generate direct current power for the charging of the battery group BG from the alternating current power supplied by an electrical grid 40, in response to a command from the battery management system 100 and/or an external device (not shown). The power conversion device 30 may generate the alternating current power from the direct current power from the battery pack 10.

The battery management system 100 measures at least one of voltage, current, temperature or swelling of each of the plurality of batteries. The battery management system 100 includes a sensing device 110, a current sensor 114, a communication device 120 and a control device 130.

The sensing device 110 includes a voltage measurement circuit 111, a temperature measurement circuit 112 and/or a swelling measurement circuit 113.

The voltage measurement circuit 111 includes a plurality of voltage sensors 151. The plurality of voltage sensors 151 is provided in a one-to-one relationship with the plurality of batteries. Referring to FIG. 2, the voltage sensor 151 is electrically connected to two terminals (i.e., positive and negative electrodes) of the corresponding battery B through a voltage sensing line. The voltage sensor 151 is configured to measure a voltage across the battery B, and generate a signal indicating the measured voltage. The control device 130 may determine the voltage of each of the plurality of batteries B_1~B_m at a preset time interval based on the signal from the voltage measurement circuit 111. Additionally, the control device 130 may further determine a voltage across the battery group BG by summing up the voltages of each of the plurality of batteries B_1~B_m.

The temperature measurement circuit 112 includes a plurality of temperature sensors 152. The plurality of temperature sensors 152 is provided in a one-to-one relationship with the plurality of batteries. Referring to FIG. 2, the temperature sensor 152 is configured to measure a temperature of the corresponding battery B, and generate a signal indicating the measured temperature. For example, a thermocouple may be used as the temperature sensor 152. The control device 130 may determine the temperature of each of the plurality of batteries B_1~B_m at the preset time interval based on the signal from the temperature measurement circuit 112.

The swelling measurement circuit 113 includes a plurality of swelling sensors 153. The plurality of swelling sensors 153 is provided in a one-to-one relationship with the plurality of batteries. The swelling sensor 153 is configured to measure an extent of swelling of the corresponding battery B, and generate a signal indicating the measured extent of swelling. For example, the swelling sensor 153 may be attached to a part of the corresponding battery B to measure a displacement from an initial value of a predetermined location of the battery B or a pressure applied to the battery B as the extent of swelling. The control device 130 may determine the extent of swelling of each of the plurality of batteries B_1~B_m at the preset time interval based on the signal from the swelling measurement circuit 113.

The current sensor 114 is electrically connected in series to the battery group BG through the power line PL. The current sensor 114 is configured to measure the current flowing through the battery group BG, and output a signal indicating the measured current to the control device 130. For example, a shunt resistor, a hall effect device or the like may be used as the current sensor 114.

The control device 130 is operably coupled to the relay 20, the sensing device 110, the power conversion device 30 and the battery diagnosis system 200. The operably coupled refers to direct/indirect connection between two elements to transmit and receive a signal in one or two directions.

The control device 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control device 130 may include a memory inside. The memory may store programs and data necessary to perform battery management methods according to the embodiments as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The control device 130 collects the signals indicating the measurement results of the sensing device 110 periodically or aperiodically. The control device 130 obtains battery parameters of each of the plurality of batteries $B\_1$~$B\_m$ based on the collected signals. In the specification, the battery parameter is an index indicating a state of the battery that is observable indirectly/directly from the battery B. For example, the battery parameter is one or a weighted average of at least two of a voltage, a temperature, an extent of swelling, a State Of Charge (SOC), a State Of Health (SOH), an internal resistance or a self-discharge rate. The SOC refers to a ratio of the remaining capacity to the full charge capacity of the battery B. The internal resistance refers to an equivalent resistance across the battery B. The self-discharge rate refers to an amount of decrease in SOC per unit time of the battery B at rest (calendar aged). The SOH refers to a ratio of the full charge capacity to the design capacity of the battery B. The full charge capacity gradually reduces from the design capacity over time. The calculation method of each of the SOC, the SOH, the internal resistance and the self-discharge rate is well known in the art, and its detailed description is omitted herein.

The control device 130 may selectively perform pre-programmed protection function(s) based on the battery parameter of the battery B. To this end, the battery management system 100 may further include a protection device 140 operably coupled to the control device 130.

The protection device 140 includes at least one of a balancing module 141 or a cooling module 142.

The balancing module 141 includes a plurality of balancing circuits 161. The plurality of balancing circuits 161 is provided in a one-to-one relationship with the plurality of batteries $B\_1$~$B\_m$. Referring to FIG. 2, the balancing circuit 161 is a series circuit of a switch SW and a discharge resistor R. The control device 130 may turn on the switch SW of the balancing circuit 161 to discharge the battery B having the voltage (or SOC) that is higher than an average voltage (or an average SOC) of the plurality of batteries $B\_1$~$B\_m$ by a predetermined value.

The cooling module 142 includes a plurality of cooling circuits 162. The plurality of cooling circuits 162 is provided in a one-to-one relationship with the plurality of batteries $B\_1$~$B\_m$. Referring to FIG. 2, the cooling circuit 162 may include, without limitation, any type of cooling circuit capable of supplying a cooling medium to the battery B such as, for example, a cooling fan and a cooling pump. The control device 130 may perform a cooling operation on the battery B having the temperature (or the extent of swelling) that is higher than an average temperature (or an average extent of swelling) of the plurality of batteries $B\_1$~$B\_m$ by a predetermined value.

The communication device 120 may be coupled to the battery diagnosis system 200 via at least one of a wired network or a wireless network to perform bidirectional communication with the battery diagnosis system 200. The wired network may be, for example, local area network (LAN), controller area network (CAN) and a daisy chain, and the wireless network may be, for example, Bluetooth, Zigbee and WiFi. The communication device 120 transmits a notification signal to the battery diagnosis system 200. The notification signal indicates the battery parameter of each of the plurality of batteries $B\_1$~$B\_m$ acquired by the battery management system 100.

The battery diagnosis system 200 is provided to improve the accuracy and efficiency of fault detection of the battery B in conjunction with the battery management system 100.

The battery diagnosis system 200 includes a communication device 210, a data preprocessing device 220 and a data analysis device 230.

The communication device 210 performs the bidirectional communication with the communication device 120 of the battery management system 100 via at least one of the wired network or the wireless network. The communication device 210 collects the notification signal from the battery management system 100. The notification signal indicates the battery parameter of each of the plurality of batteries $B\_1$~$B\_m$ acquired by the battery management system 100.

The data preprocessing device 220 includes a database 221, and is connected to the communication device 210 to extract a value of the battery parameter of each battery from the notification signal collected by the communication device 210 and record it in the database 221 in a time series. Accordingly, big data indicating a change history of the battery parameter of each of the plurality of batteries $B\_1$~$B\_m$ is periodically or aperiodically updated by the data preprocessing device 220. The data preprocessing device 220 may be implemented in hardware using a data processing device such as a microprocessors.

When the big data is updated by the data preprocessing device 220, the data analysis device 230 extracts a data set including a plurality of characteristics values indicating the battery parameter of each of the plurality of batteries $B\_1$~$B\_m$ from the updated big data. For example, in case that the battery parameter is voltage, the plurality of characteristics values is a numerical representation of the magnitude of voltage across each of the plurality of batteries $B\_1$~$B\_m$. The data analysis device 230 determines dispersion information of the data set, and determines a fault in each of the plurality of batteries $B\_1$~$B\_m$ based on the dispersion information and the plurality of characteristics values using statistical analysis. The statistical analysis may employ, for example, process capability indices (Cp, Cpk). The dispersion information of the data set indicates variability of the plurality of characteristics values, and may include, for example, a standard deviation, a variance or a range (a difference between maximum and minimum). The dispersion information of the data set may further include an average of the plurality of characteristics values.

When the notification signal is periodically collected at a predetermined time interval (for example, 1 minute, 1 hour or 1 day), the data analysis device 230 may periodically extract the data set and determine the dispersion information at the predetermined time interval.

Figure 3:
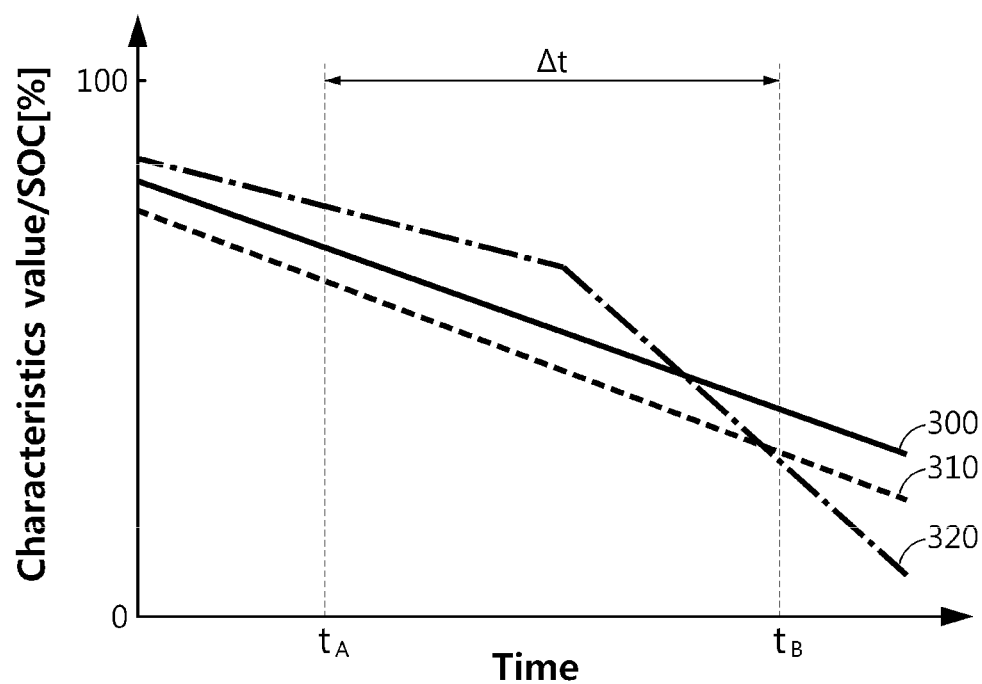
FIG. 3 is a graph exemplarily showing a time series change in a plurality of characteristics values acquired periodically from a plurality of batteries.

FIG. 3 is a graph exemplarily showing a time series change in the plurality of characteristics values acquired periodically from the plurality of batteries.

FIG. 3 shows a time series change in SOC as the characteristics value of the battery B over a certain time period during the operation of the battery group BG. A curve 300 indicates a change in average SOC of the plurality of batteries $B\_1$~$B\_m$, a curve 310 indicates a change in SOC of the battery $B\_i$ (i is a natural number of m or smaller), and a curve 320 indicates a change in SOC of the battery B_j (j is a natural number of m or smaller and is different from i).

Referring to FIG. 3, each of time point $t_A$ and time point $t_B$ is a time point at which the SOC of the battery B is acquired (determined) by the control device 130, and there is a predetermined time interval Δt between them. Hereinafter, it is assumed that each value associated with the time point $t_B$ is acquired in the current cycle, and each value associated with the time point $t_A$ is acquired in the previous cycle.

The curve 300 and the curve 310 gently change at the similar level over the above time period, while the curve 320 sharply reduces from a certain time point between the time point $t_A$ and the time point $t_B$. Accordingly, there is a high likelihood that a fault (for example, an internal short circuit) occurred in the battery B_j corresponding to the curve 320. However, at the time point $t_B$, when a difference between the curve 300 and the curve 320 is not too large, a fault in the battery B_j may not be detected simply based on a difference between the characteristics value and the average.

Figure 4:
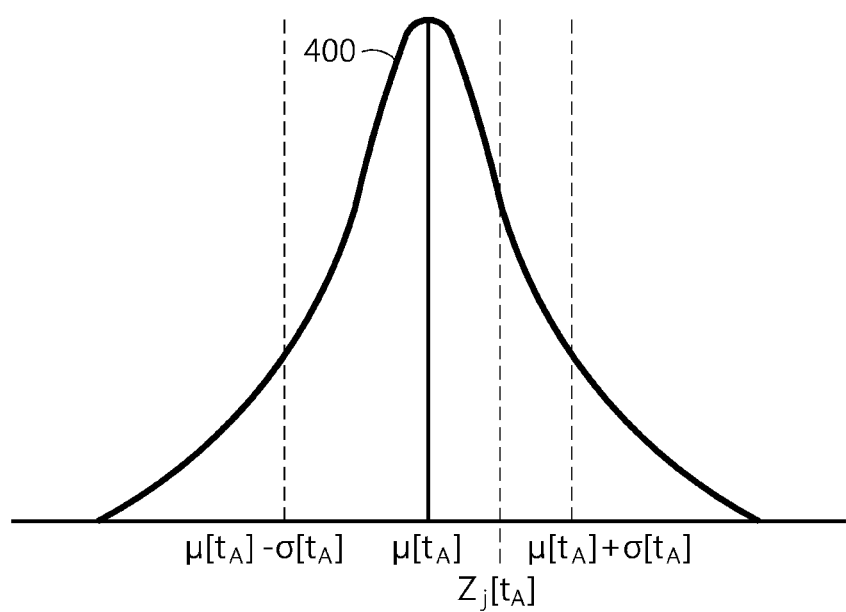
FIGS. 4 and 5 are graphs referenced in describing the operation of detecting a fault in a battery using dispersion information of a data set acquired at a predetermined time interval.
Figure 5:
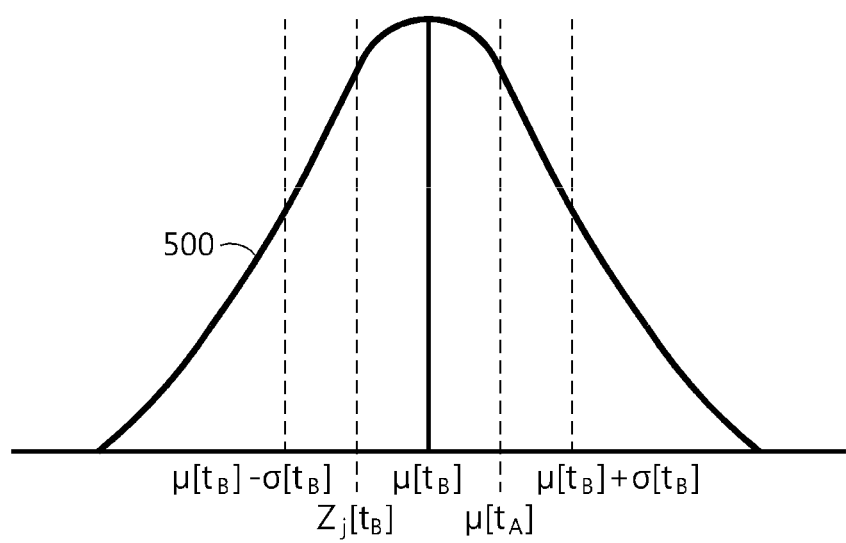

FIGS. 4 and 5 are graphs referenced in describing the operation of detecting a fault in the battery using the dispersion information of the data set acquired at the predetermined time interval.

A curve 400 of FIG. 4 shows a normal distribution curve defined by the standard deviation and the average of the data set associated with the time point $t_A$ of FIG. 3. In FIG. 4, $\mu[t_A]$ denotes the average SOC of the plurality of batteries B_1~B_m, $\sigma[t_A]$ denotes the standard deviation of SOC of the plurality of batteries B_1~B_m, and $Z_j[t_A]$ denotes the SOC of the battery B_j.

A curve 500 of FIG. 5 shows a normal distribution curve defined by the standard deviation and average of the data set associated with the time point $t_B$ of FIG. 3. In FIG. 5, $\mu[t_B]$ denotes the average SOC of the plurality of batteries B_1~B_m, $\sigma[t_B]$ denotes the standard deviation of SOC of the plurality of batteries B_1~B_m, and $Z_j[t_B]$ denotes the SOC of the battery B_j.

Meanwhile, when the battery parameter is periodically acquired by the battery management system 100 at the predetermined time interval Δt, the data set is newly extracted from the big data at the predetermined time interval Δt. That is, the data set extracted newly each cycle and its dispersion information are different from the data set of the previous cycle and its dispersion information. Accordingly, to accurately detect a fault in the battery B using the change history of the data set, it is preferred to compare a relationship of the current cycle between the dispersion information reflected on the data set of the current cycle and the characteristics value of the battery B, with a relationship of the previous cycle between the dispersion information reflected on the dataset of the previous cycle and the characteristics value of the battery B.

Fault Detection According to First Embodiment

The data analysis device 230 may determine a deviation of interest of the battery B_j at the predetermined time interval Δt. The deviation of interest is a difference between an average of the plurality of characteristics values included in the data set and the characteristics value of the battery B.

At the time point t, $D_j[t]$ may denote the deviation of interest of the battery B_j at the time point t. Referring to FIGS. 4 and 5, the data analysis device 230 may determine the deviation of interest $D_j[t_A]$ of the battery B_j at the time point $t_A$ corresponding to the previous cycle to be equal to $(\mu[t_A]-Z_j[t_A])$, and the deviation of interest $D_j[t_B]$ of the battery B_j at the time point $t_B$ corresponding to the current cycle to be equal to $(\mu[t_B]-Z_j[t_B])$.

Subsequently, the data analysis device 230 may determine a deviation ratio of the battery B_j. The deviation ratio is a ratio of the deviation of interest to the standard deviation. Referring to FIGS. 4 and 5, the data analysis device 230 may determine the deviation ratio of the battery B_j at the time point $t_A$ to be equal to $D_j[t_A]/\sigma[t_A]$, and the deviation ratio of the battery B_j at the time point $t_B$ to be equal to $D_j[t_B]/\sigma[t_B]$.

Subsequently, the data analysis device 230 may determine a change of the deviation ratio of the battery B_j. In the specification, a change (or an increase, a decrease) of a variate is a difference between a value of the current cycle and a value of the previous cycle. For example, at the time point $t_B$, the change in the deviation ratio of the battery B_j may be determined to be equal to $(D_j[t_B]/\sigma[t_B]-D_j[t_A]/\sigma[t_A])$.

Meanwhile, independently of the calculation operation associated with the deviation ratio and its change, the data analysis device 230 may determine a reference change at the predetermined time interval Δt based on an increase in accumulated energy used in the charge/discharge of the battery group BG. The increase in accumulated energy may be determined by integrating the magnitude of charge current value and the magnitude of discharge current value measured by the current sensor 114 over time. For example, when the charge current value and the discharge current value accumulated over the predetermined time period Δt from the time point $t_A$ to the time point $t_B$ are 10 Ah (Ampere hour) and 15 Ah respectively, the data analysis device 230 may determine (10+15) Ah as the increase in accumulated energy at the time point $t_B$.

The data analysis device 230 may determine a usage score of the battery group BG based on the increase in accumulated energy determined at the predetermined time interval Δt. the usage score is a degradation factor having a positive correlation with each of energy accumulated from the manufacture time of the battery group BG and the elapsed time. For example, the following Equation 1 may be used to determine the usage score.

$$P[t]=P[t-\Delta t]+f(\Delta E[t],\Delta t) \quad \text{<Equation 1>}$$

In the above Equation 1, t is the current time point (for example, $t_A$), $P[t-\Delta t]$ is the usage score of the previous cycle, $\Delta E[t]$ is the increase in accumulated energy, $f(\Delta E(t),\Delta t)$ is the increase in the usage score, and $P[t]$ is the usage score of the current cycle. That is, by the above Equation 1, the usage score of the current cycle is determined by summing up the usage score of the previous cycle and the increase in usage score. $f(\Delta E[t],\Delta t)$ may be acquired from a preset function to output a value having a positive correlation with each of $\Delta E[t]$ and $\Delta t$. That is, the following Equations 2 and 3 indicate exemplary relationships of $f(\Delta E[t],\Delta t)$, $\Delta E[t]$ and $\Delta t$.

$$f(\Delta E[t],\Delta t)=\Delta E[t]\times W_1+\Delta t\times W_2 \quad \text{<Equation 2>}$$

In the above Equation 2, each of $W_1$ and $W_2$ is a preset coefficient to have a positive value.

$$f(\Delta E[t],\Delta t)=(\Delta E[t]+W_3)^{\Delta t\times W_4}\times W_5 \quad \text{<Equation 3>}$$

In the above Equation 3, each of $W_3$, $W_4$ and $W_5$ is a preset coefficient to have a positive value.

The data analysis device 230 may determine the reference change based on the usage score of the current cycle using a preset conversion function to have a positive correlation with the usage score. For example, the following Equation 4 may be used to determine the reference change.

$$K[t]=U_1\times P[t]+U_2 \quad \text{<Equation 4>}$$

In the above Equation 4, K[t] is the reference change at the time point t, and each of $U_1$ and $U_2$ is a preset coefficient to have a positive value.

When the change (or its absolute value) in the deviation ratio of the battery B at the time point t is larger than the reference change K[t], the data analysis device 230 may determine the battery B as faulty. For example, where $t=t_B$, $(D_j[t_B]/\sigma[t_B]-D_j[t_A]/\sigma[t_A])>K[t]$ or $-(D_j[t_B]/\sigma[t_B]-D_j[t_A]/\sigma[t_A])<-K[t]$, the battery B_j is determined as faulty.

Fault Detection According to Second Embodiment

In the second embodiment, in the same way as the first embodiment, the data analysis device 230 may determine the deviation of interest of the battery B_j, the usage score P[t] of the battery group BG and the increase in accumulated energy ΔE[t] at the predetermined time interval Δt.

The data analysis device 230 may determine a reference coefficient based on the usage score of the current cycle using the preset conversion function to have a positive correlation with the usage score. For example, the following Equation 5 may be used to determine the reference coefficient.

$$F[t]=Y_1 \times P[t]+Y_2 \qquad <\text{Equation 5}>$$

In the above Equation 5, F[t] is the reference coefficient at the time point t, and each of $Y_1$ and $Y_2$ is a preset coefficient to have a positive value.

When the deviation of interest (or its absolute value) of the battery B at the time point t is larger than the allowable limit as a result of multiplying the reference coefficient F[t] by the standard deviation μ[t], the data analysis device 230 may determine the battery B_j as faulty. For example, where $D_j[t_B]>(F[t_B]\times\sigma[t_B])$ or $-D_j[t_B]<-(F[t_B]\times\sigma[t_B])$ at $t=t_B$, the battery B_j is determined as faulty.

Although the fault detection according to the first and second embodiments as described above is described based on the battery B_j, it may be commonly applied to each of the plurality of batteries B_1~B_m. That is, the data analysis device 230 may determine whether each of the plurality of batteries B_1~B_m is faulty at the predetermined time interval Δt by the method according to the first embodiment and/or the second embodiment.

When the number of faulty batteries among the plurality of batteries B_1~B_m is a predetermined number or more, the data analysis device 230 may transmit a warning message to the battery management system 100 using the communication device 210. In response to the warning message, the battery management system 100 may change the battery group BG from a cycle state to a calendar state. The cycle state may be such that the relay 20 is controlled to an ON state, and the calendar state may be such that the relay 20 is controlled to an OFF state.

Figure 6:
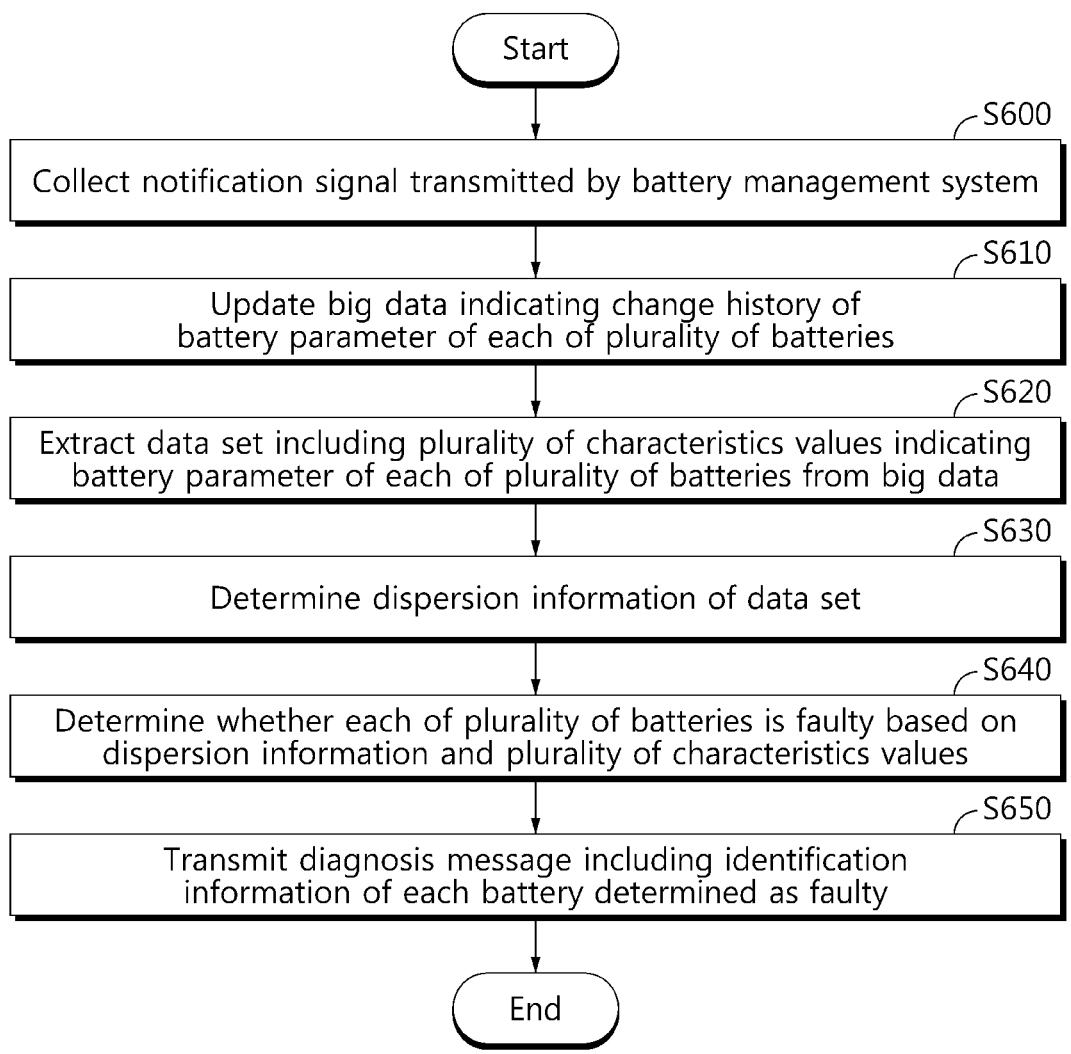
FIG. 6 is a schematic flowchart of a battery diagnosis method according to the present disclosure.
Figure 7:
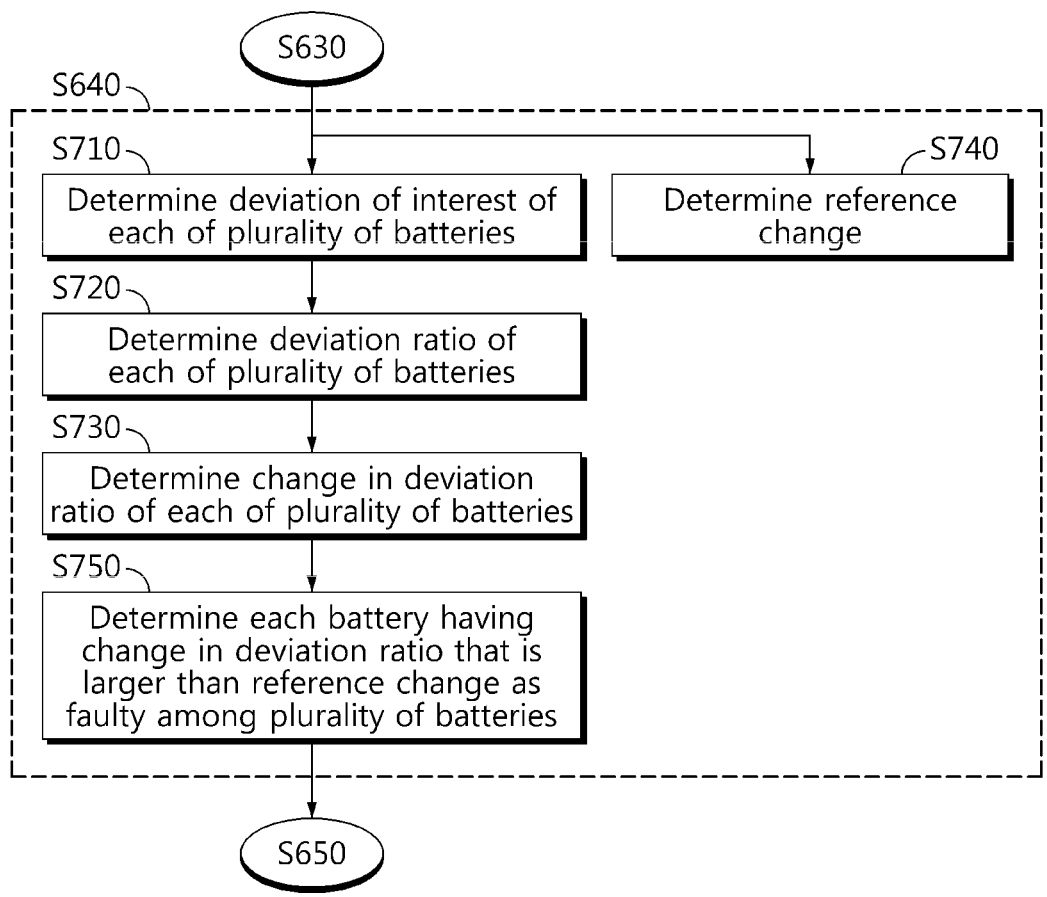
FIG. 7 is a schematic flowchart of a fault detection process according to a first embodiment for implementing S640 in FIG. 6.
Figure 8:
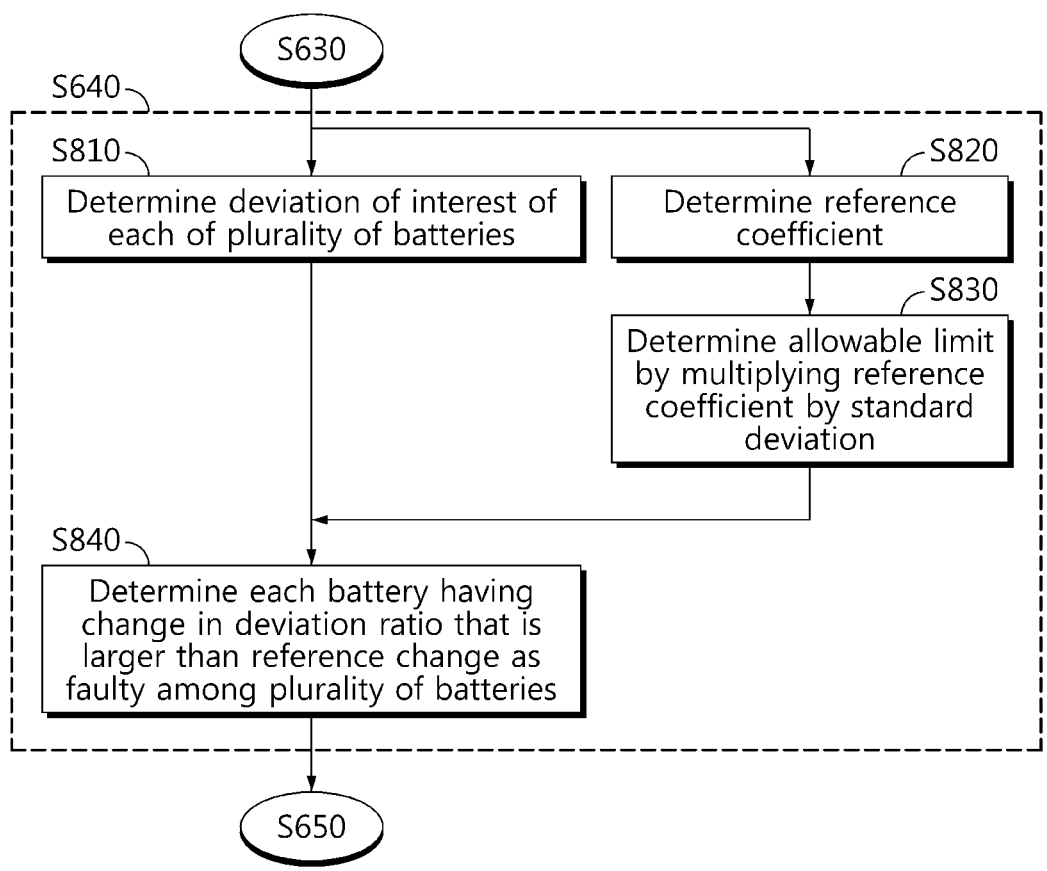
FIG. 8 is a schematic flowchart of a fault detection process according to a second embodiment for implementing S640 in FIG. 6.

FIG. 6 is a schematic flowchart of a battery diagnosis method according to the present disclosure, FIG. 7 is a schematic flowchart of a fault detection process according to the first embodiment for implementing S640 in FIG. 6, and FIG. 8 is a schematic flowchart of a fault detection process according to the second embodiment for implementing S640 in FIG. 6. The method of FIG. 6 may be periodically performed at the predetermined time interval Δt from the manufacture time of the battery group BG.

Referring to FIGS. 1 to 6, in step S600, the communication device 210 collects the notification signal transmitted by the battery management system 100.

In step S610, the data preprocessing device 220 updates big data indicating a change history of the battery parameter of each of the plurality of batteries B_1~B_m based on the collected notification signal. That is, the data preprocessing device 220 manages the big data by extracting data required for battery fault detection from the notification signal at the predetermined time interval Δt, and records (accumulates) it in the database 221 in a time series.

In step S620, the data analysis device 230 extracts a data set including a plurality of characteristics values indicating the battery parameter of each of the plurality of batteries B_1~B_m) from the big data.

In step S630, the data analysis device 230 determines dispersion information of the data set. The dispersion information may include a standard deviation and an average of the plurality of characteristics values included in the data set. The periodically determined dispersion information of the data set may be additionally recorded in the database 221 as big data.

In step S640, the data analysis device 230 determines whether each of the plurality of batteries B_1~B_m is faulty based on the dispersion information and the plurality of characteristics values.

Referring to FIG. 7, the step S640 according to the first embodiment includes steps S710 to S750.

In step S710, the data analysis device 230 determines a deviation of interest of each of the plurality of batteries B_1~B_m. The deviation of interest is a difference between the average and the characteristics value. For example, the deviation of interest $D_j[t_B]$ of the battery B_j at the time point $t_B$ is $(\mu[t_B]-Z_j[t_B])$.

In step S720, the data analysis device 230 determines a deviation ratio of each of the plurality of batteries B_1~B_m, the deviation ratio being a ratio of the deviation of interest to the standard deviation. For example, the deviation ratio of the battery B_j at the time point $t_B$ is $D_j[t_B]/\sigma[t_B]$.

In step S730, the data analysis device 230 determines a change in the deviation ratio of each of the plurality of batteries B_1~B_m. For example, the change in deviation ratio of the battery B_j at the time point $t_B$ is $(D_j[t_B]/\sigma[t_B]-D_j[t_A]/\sigma[t_A])$.

In step S740, the data analysis device 230 determines a reference change P[t] based on the increase in accumulated energy ΔE[t] used in the charge/discharge from the manufacture time of the battery group BG (see Equations 1 to 4).

In step S750, the data analysis device 230 determines each battery having a larger change in the deviation ratio than the reference change as faulty among the plurality of batteries B_1~B_m.

Referring to FIG. 8, the step S640 according to the second embodiment includes steps S810 to S840.

In step S810, the data analysis device 230 determines a deviation of interest of each of the plurality of batteries B_1~B_m. The step S810 is the same as the step S710 of FIG. 7.

In step S820, the data analysis device 230 determines a reference coefficient K[t] based on the increase in accumulated energy ΔE[t] used in the charge/discharge from the manufacture time of the battery group BG (see Equations 1 to 3 and 5).

In step S830, the data analysis device 230 determines an allowable limit by multiplying the reference coefficient K[t] by the standard deviation.

In step S840, the data analysis device 230 determines each battery having a larger deviation of interest than the allowable limit as faulty among the plurality of batteries B_1~B_m.

In step S650, the data analysis device 230 transmits a diagnosis message including identification information of each battery determined as faulty among the plurality of batteries B_1~B_m to the battery management system 100 using the communication device 210.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery diagnosis system for a battery pack having a battery group of a plurality of batteries connected in series; and a battery management system electrically coupled to two terminals of each of the plurality of batteries and configured to transmit a notification signal indicating a battery parameter of each battery, the battery diagnosis system comprising:
a communication device configured to collect the notification signal via at least one of a wired network or a wireless network;
a data preprocessing device configured to update big data indicating a change history of the battery parameter of each battery based on the notification signal; and
a data analysis device configured to:
extract a data set including a plurality of characteristics values indicating the battery parameter of each of the plurality of batteries from the big data,
determine dispersion information of the data set, wherein the dispersion information includes a standard deviation and an average of the plurality of characteristics values,
determine, for each battery, a deviation ratio, wherein the deviation ratio is a ratio of a deviation of interest to the standard deviation, and the deviation of interest is a difference between the average of the plurality of characteristics values and each of the plurality of characteristics values,
determine, for each battery, a change in the deviation ratio, and
determine each battery having the change in the deviation ratio that is larger than a reference change as faulty.

2. The battery diagnosis system according to claim 1, wherein the data analysis device is configured to:
at a predetermined time interval,
determine the reference change based on an increase in accumulated energy used in charge/discharge from a manufacture time of the battery group.

3. The battery diagnosis system according to claim 2, wherein the data analysis device is configured to:
at the predetermine time interval,
determine a usage score based on the increase in accumulated energy, wherein the usage score is a degradation factor having a positive correlation with an elapsed time from the manufacture time of the battery group and the accumulated energy, and
determine the reference change corresponding to the usage score using a first conversion function defining a positive correlation between the usage score and the reference change.

4. The battery diagnosis system according to claim 1, wherein the data analysis device is configured to:
at a predetermined time interval,
transmit a diagnosis message including identification information of each battery determined as faulty among the plurality of batteries to the battery management system using the communication device.

5. The battery diagnosis system according to claim 1, wherein the battery parameter is one or a weighted average of at least two of a voltage, a temperature, an extent of swelling, a State Of Charge (SOC), a State Of Health (SOH), an internal resistance or a self-discharge rate.

6. A power system comprising the battery diagnosis system according to claim 1.

7. A battery diagnosis method that is executable at a predetermined time interval by the battery diagnosis system according to claim 1, the battery diagnosis method comprising:
updating, by the battery diagnosis system, the big data indicating the change history of the battery parameter of each battery based on the notification signal transmitted by the battery management system;
extracting, by the battery diagnosis system, the data set including the plurality of characteristics values indicating the battery parameter of each of the plurality of batteries from the big data;
determining, by the battery diagnosis system, the dispersion information of the data set, wherein the dispersion information includes the standard deviation and the average of the plurality of characteristics values; and
determining, for each battery, the deviation ratio, wherein the deviation ratio is the ratio of the deviation of interest to the standard deviation, and the deviation of interest is the difference between the average of the plurality of characteristics values and each of the plurality of characteristics values,
determining, for each battery, the change in the deviation ratio, and
determining each battery having the change in the deviation ratio that is larger than the reference change as faulty.

8. The battery diagnosis method according to claim 7, further comprising:
determining the reference change based on an increase in accumulated energy used in charge/discharge from a manufacture time of the battery group.

9. A battery diagnosis system for a battery pack having a battery group of a plurality of batteries connected in series; and a battery management system electrically coupled to two terminals of each of the plurality of batteries and configured to transmit a notification signal indicating a battery parameter of each battery, the battery diagnosis system comprising:
- a communication device configured to collect the notification signal via at least one of a wired network or a wireless network;
- a data preprocessing device configured to update big data indicating a change history of the battery parameter of each battery based on the notification signal; and
- a data analysis device configured to:
- extract a data set including a plurality of characteristics values indicating the battery parameter of each of the plurality of batteries from the big data, determine dispersion information of the data set, wherein the dispersion information includes a standard deviation and an average of the plurality of characteristics values,
- wherein the data analysis device is configured to:
- at a predetermined time interval,
- determine, for each battery, a deviation of interest, wherein the deviation of interest is a difference between the average of the plurality of characteristics values and the characteristics values, and
- wherein the data analysis device is further configured to:
- at the predetermined time interval,
- determine, for each battery, a reference coefficient based on an increase in accumulated energy used in charge/discharge from a manufacture time of the battery group, and
- determine each battery having the deviation of interest that is larger than an allowable limit as faulty, wherein the allowable limit is based on the reference coefficient and the standard deviation.

10. The battery diagnosis system according to claim 9, wherein the data analysis device is configured to:
- at the predetermined time interval,
- determine a usage score based on the increase in accumulated energy, wherein the usage score is a degradation factor having a positive correlation with an elapsed time from the manufacture time of the battery group and the accumulated energy, and
- determine the reference coefficient corresponding to the usage score using a second conversion function defining a positive correlation between the usage score and the reference coefficient.

11. A battery diagnosis method that is executable at the predetermined time interval by the battery diagnosis system according to claim 9, the battery diagnosis method comprising:
- updating, by the battery diagnosis system, the big data indicating the change history of the battery parameter of each battery based on the notification signal transmitted by the battery management system;
- extracting, by the battery diagnosis system, the data set including the plurality of characteristics values indicating the battery parameter of each of the plurality of batteries from the big data;
- determining, by the battery diagnosis system, the dispersion information of the data set, wherein the dispersion information includes the standard deviation and the average of the plurality of characteristics values;
- determining, for each battery, the deviation of interest for each battery, wherein the deviation of interest is the difference between the average of the plurality of characteristics values and the plurality of characteristics values;
- determining, for each battery, the reference coefficient based on the increase in accumulated energy used in charge/discharge from the manufacture time of the battery group; and
- determining each battery having the deviation of interest that is larger than the allowable limit as faulty, wherein the allowable limit is based on the reference coefficient and the standard deviation.

12. The battery diagnosis method according to claim 11, wherein the reference coefficient is determined as:

$$F[t]=Y_1 \times P[t]+Y_2$$

where F[t] is the reference coefficient at a time point t, and each of $Y_1$ and $Y_2$ is a preset coefficient to have a positive value.

13. A power system comprising the battery diagnosis system according to claim 9.

14. The battery diagnosis system according to claim 9, wherein the reference coefficient is determined as:

$$F[t]=Y_1 \times P[t]+Y_2$$

where F[t] is the reference coefficient at a time point t, and each of $Y_1$ and $Y_2$ is a preset coefficient to have a positive value.

* * * * *